United States Patent [19]
Koga

[11] Patent Number: 5,166,638
[45] Date of Patent: Nov. 24, 1992

[54] DIFFERENTIAL AMPLIFIER HAVING OUTPUT STAGE QUICKLY BROUGHT INTO INACTIVE CONDITION BY A CONTROL SIGNAL

[75] Inventor: Hiroshi Koga, Tokyo, Japan

[73] Assignee: NEC Corporation, Tokyo, Japan

[21] Appl. No.: 761,189

[22] Filed: Sep. 18, 1991

[30] Foreign Application Priority Data

Sep. 18, 1990 [JP] Japan ................................. 2-248231

[51] Int. Cl.$^5$ .............................................. H03F 3/45
[52] U.S. Cl. ...................................... 330/261; 330/51; 330/296
[58] Field of Search ........................ 330/51, 261, 296

[56] References Cited

U.S. PATENT DOCUMENTS 4,546,327 10/1985 Suzuki et al .................... 330/261 X

*Primary Examiner*—James B. Mullins

[57] ABSTRACT

An amplifier circuit configured to be selectively brought into an active condition or in an inactive condition by a control signal, comprises an input differential circuit stage having a pair of input terminals and one output node, and an output emitter follower stage having a driving NPN transistor having a base connected to the output node and a collector connected to a high voltage Vcc. An emitter of the driving NPN transistor is connected to an output terminal and a collector of an active load NPN transistor having an emitter connected to a low voltage Vss. A control circuit is connected to a base of the active load NPN transistor and is controlled by the control signal so as to turn on the active load NPN transistor in response to an active control signal and to turn off the active load NPN transistor in response to an inactive control signal. Another control circuit is connected to the base of the driving transistor and controlled by the control signal so as to cut off a base current of the driving transistor in synchronism with the inactive control signal.

8 Claims, 2 Drawing Sheets

DIFFERENTIAL AMPLIFIER HAVING OUTPUT STAGE QUICKLY BROUGHT INTO INACTIVE CONDITION BY A CONTROL SIGNAL

BACKGROUND OF THE INVENTION

1. Field of the Invention

The present invention relates to a differential amplifier circuit, and more specifically to a differential amplifier circuit configured to be selectively brought either into an active condition or in an inactive condition by a control signal.

2. Description of Related Art

One typical conventional differential amplifier circuit configured to be selectively brought either into an active condition or in an inactive condition by a control signal, comprises an input stage composed of a differential amplifier and an output stage composed of an emitter follower. When the differential amplifier circuit should be maintained in the active condition, the input and output stages are maintained in an active condition by the control signal, so that an input signal is amplified by the input stage and outputted through the output stage. On the other hand, if the differential amplifier circuit should be maintained in the inactive condition, the input and output stages are brought into an inactive condition by the control signal, so that the output stage supplies no output current regardless of a level of the input signal supplied to the input stage.

In the above mentioned conventional amplifier circuit, when the input and output stages are brought from the active condition into an inactive condition by the control signal, the output stage is not immediately cut off. Specifically, the output stage continues to flow the output current for a time period of several tens microseconds to several hundreds microseconds after the control signal is brought from a condition indicating that the differential amplifier circuit should be maintained in the active condition to another condition indicating that the differential amplifier circuit should be brought into the inactive condition.

In other words, the conventional amplifier circuit is disadvantageous in that it has a relative long transition time from the active condition to the inactive condition.

SUMMARY OF THE INVENTION

Accordingly, it is an object of the present invention to provide a differential amplifier circuit which has overcome the above mentioned defect of the conventional one.

Another object of the present invention is to provide a differential amplifier circuit, capable of having a remarkably shortened transition time from the active condition to the inactive condition, with a simple additional circuit.

The above and other objects of the present invention are achieved in accordance with the present invention by an amplifier circuit configured to be selectively brought into an active condition or in an inactive condition by a control signal, the amplifier circuit comprising an input stage having at least one input connected to an input terminal and one output, an output stage having a driving transistor connected in the form of an emitter follower and having a base connected to receive the output of the input stage and an emitter connected to an output terminal, a current source circuit connected to the emitter of the driving transistor and controlled by the control signal so as to supply a current required for operation of the driving transistor when the control signal indicates that the amplifier circuit should be put in the active condition, and to cut off the current required for operation of the driving transistor when the control signal indicates that the amplifier circuit should be put in the inactive condition, and a control circuit connected to the base of the driving transistor and controlled by the control signal so as to cut off a base current of the driving transistor in synchronism with the control signal indicating that the amplifier circuit should be put in the inactive condition.

With the above mentioned arrangement, when the control signal is brought into a condition indicating that the amplifier circuit should be put in the inactive condition, the base current of the driving transistor having the emitter connected to the output terminal is cut off. Therefore, an electric charge of a base parasitic capacitance of the driving transistor is rapidly discharged, and accordingly, the driving transistor is rapidly cut off, so that the output current supplied from the output stage is also rapidly cut off. Thus, the transition time from the active condition to the inactive condition can be greatly shortened.

The above and other objects, features and advantages of the present invention will be apparent from the following description of preferred embodiments of the invention with reference to the accompanying drawings.

DESCRIPTION OF THE PREFERRED EMBODIMENTS

Figure 1:
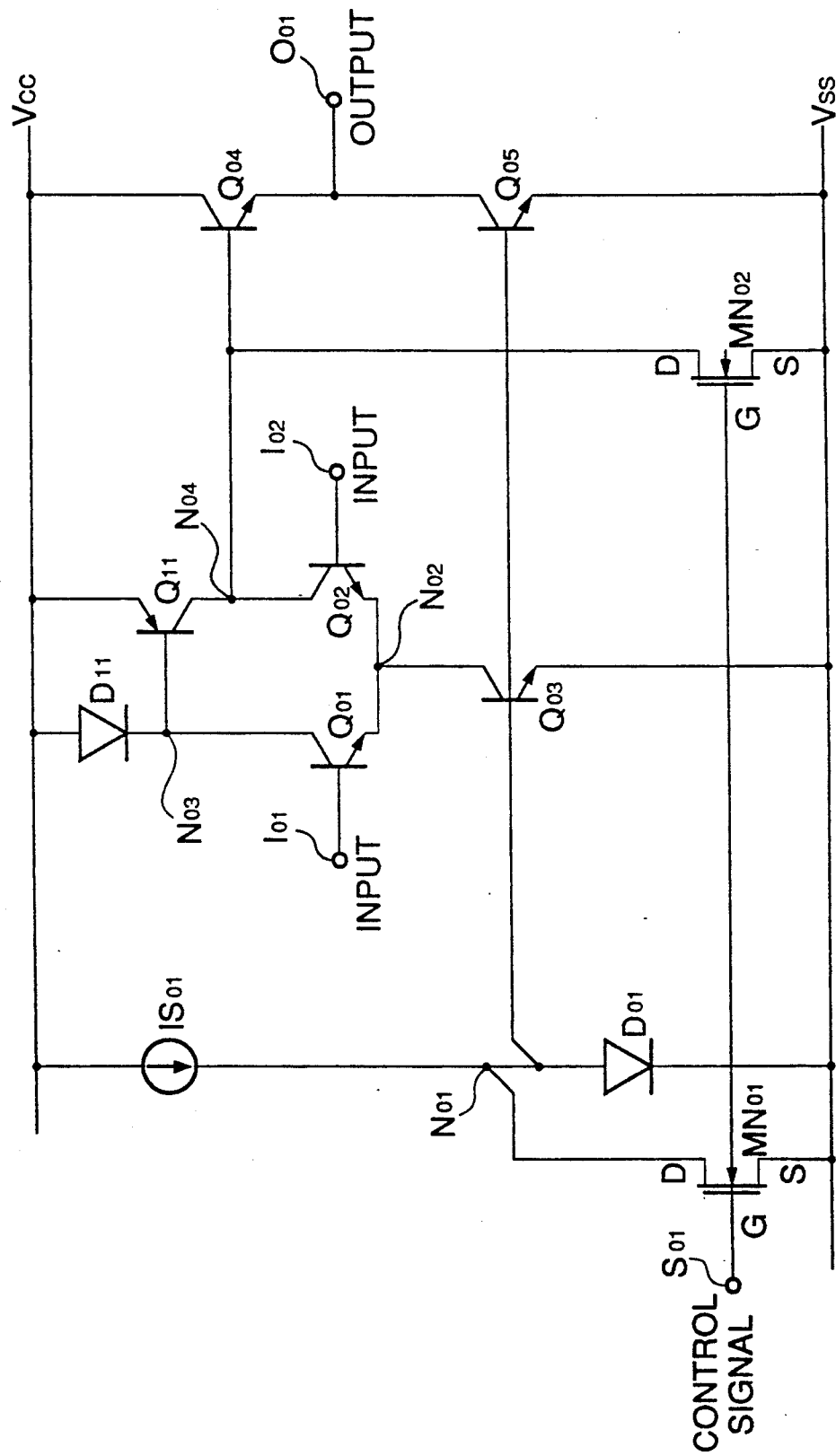
FIG. 1 is a circuit diagram of a first embodiment of the differential amplifier circuit in accordance with the present invention.

Referring to FIG. 1, there is shown a circuit diagram of a first embodiment of the differential amplifier circuit in accordance with the present invention.

The shown circuit includes a constant current source $IS_{01}$ connected between a high power supply voltage Vcc and a first node $N_{01}$, and a diode $D_{01}$ having an anode connected to the first node $N_{01}$ and a cathode connected to a low power supply voltage Vss. In addition, there is provided an N-channel MOS transistor $MN_{01}$ having a drain connected to the first node $N_{01}$ and a source connected to the low power supply voltage Vss. A gate of the MOS transistor $MN_{01}$ is connected to a control signal input terminal $S_{01}$ so as to receive a control signal.

The shown circuit also includes a pair of input signal terminals $I_{01}$ and $I_{02}$ for receiving a pair of input signals complementary to each other, respectively, and a pair of NPN transistors $Q_{01}$ and $Q_{02}$ connected at their base to the input signal terminals $I_{01}$ and $I_{02}$, respectively. Emitters of the NPN transistors $Q_{01}$ and $Q_{02}$ are connected in common to a second node $N_{02}$, which is connected to a collector of another NPN transistor $Q_{03}$ having a base connected to the node $N_{01}$ and an emitter connected to the low power supply voltage Vss. A collector of the transistor $Q_{01}$ is connected to a node $N_{03}$, which is connected to a cathode of another diode $D_{11}$ having an anode connected to the high power supply voltage Vcc. A collector of the transistor $Q_{02}$ is connected to a fourth node $N_{04}$, which is connected to an collector of a PNP transistor $Q_{11}$ having a base connected to the third node $N_{03}$ and an emitter connected to the high power supply voltage Vcc.

The fourth node $N_{04}$ constitutes an output of an input stage in the form of a differential circuit, and is connected to a base of an NPN transistor $Q_{04}$, which constitutes an output stage in the form of an emitter follower. A collector of the transistor $Q_{04}$ is connected to the high power supply voltage Vcc, and an emitter of the transistor $Q_{04}$ is connected to an output signal terminal $O_{01}$ and a collector of a NPN transistor $Q_{05}$. The transistor $Q_{05}$ has a base connected to the first node $N_{01}$ and an emitter connected to the low power supply voltage Vss.

In addition, the fourth node $N_{04}$ is connected to a drain of another N-channel MOS transistor $MN_{02}$, which has a gate connected to the control signal terminal $S_{01}$ and a source connected to the low power supply voltage Vss.

In the above mentioned circuit, the diode $D_{01}$ gives a forward direction voltage drop determined by a PN junction of the diode, to the bases of the transistors $Q_{03}$ and $Q_{05}$. Therefore, the diode $D_{01}$ and the transistors $Q_{03}$ and $Q_{05}$ form a current mirror circuit in which a constant current flows through the collector of each of the transistors $Q_{03}$ and $Q_{05}$. Similarly, the diode $D_{11}$ and the transistor $Q_{11}$ form a current mirror circuit which functions as a active load of the differential circuit.

Now, operation of the amplifier circuit shown in FIG. 1 will be described.

When the control signal of a low level is applied to the control signal terminal $S_{01}$, the MOS transistors $MN_{01}$ and $MN_{02}$ are turned off. Accordingly, most of a current supplied from the constant current source $IS_{01}$ is caused to flow through the diode $D_{01}$, and therefore, a corresponding current flows through each of the NPN transistors $Q_{03}$ and $Q_{05}$ which constitute the current mirror circuit together with the diode $D_{01}$. On the other hand, since the MOS transistor $MN_{02}$ is off, a base current of the NPN transistor $Q_{04}$ is not bypassed or shunted by the MOS transistor $MN_{02}$. Therefore, the differential circuit composed of the transistors $Q_{01}$ and $Q_{02}$ functions as the input stage for amplifying the input signal applied to the input signal terminals $I_{01}$ and $I_{02}$, and the transistors $Q_{04}$ and $Q_{05}$ function as the emitter follower for outputting the output of the input stage.

On the other hand, when the control signal of a high level is applied to the control signal terminal $S_{01}$, the MOS transistors $MN_{01}$ and $MN_{02}$ are turned on. Accordingly, most of the current supplied from the constant current source $IS_{01}$ is caused to flow through the MOS transistor $MN_{01}$. Therefore, almost no current flows through the diode $D_{01}$, and correspondingly, almost no current flows through each of the NPN transistors $Q_{03}$ and $Q_{05}$. On the other hand, since the MOS transistor $MN_{02}$ is on, an electric charge stored in a parasitic capacitance of the node $N_{04}$ and hence the base of the NPN transistor $Q_{04}$ is quickly discharged. In other words, a potential on the node $N_{04}$ is caused to quickly drop to a level which is almost the same as the low power supply voltage Vss. Therefore, a base current of the NPN transistor $Q_{04}$ is cut off by the MOS transistor $MN_{02}$. Thus, the transition time from the active condition to the inactive condition is remarkably shortened.

Figure 2:
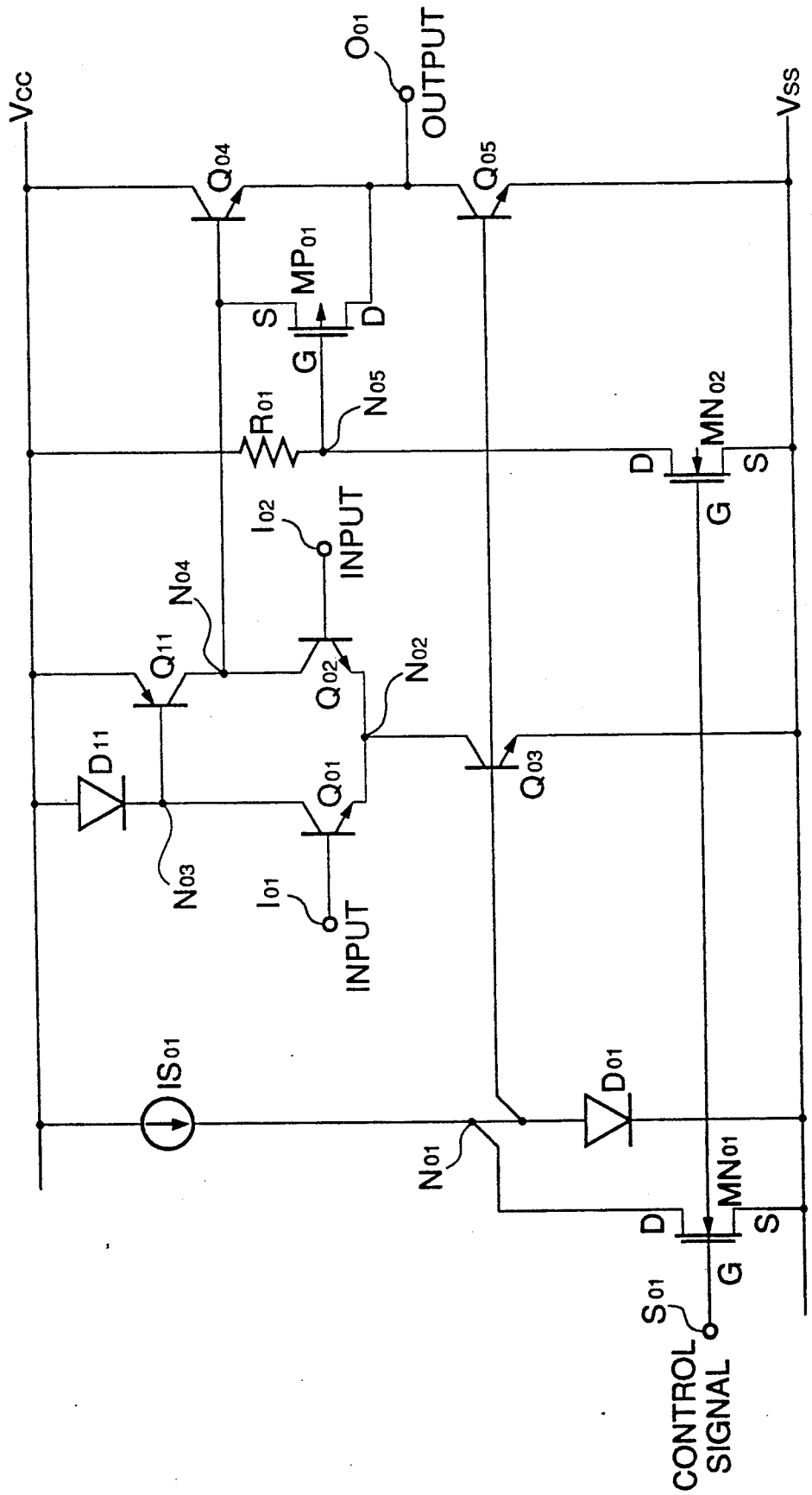
FIG. 2 is a circuit diagram of a second embodiment of the differential amplifier circuit in accordance with the present invention.

Referring to FIG. 2, there is shown a circuit diagram of a second embodiment of the differential amplifier circuit in accordance with the present invention. In FIG. 2, elements similar or corresponding to those shown in FIG. 1 are given the same Reference Numerals, and explanation thereof will be omitted for simplification of description.

As seen from comparison between FIGS. 1 and 2, the second embodiment is characterized in that the drain of the MOS transistor $MN_{02}$ is connected to a fifth node $N_{05}$, not the fourth node $N_{04}$, and the fifth node $N_{05}$ is connected to the high power supply voltage Vcc through a resistor $R_{01}$, and also to a gate of a P-channel transistor $MP_{01}$ having a drain connected to the emitter of the transistor $Q_{04}$ and a source connected to the base of the transistor $Q_{04}$.

Now, operation of the amplifier circuit shown in FIG. 2 will be described.

When the control signal of a low level is applied to the control signal terminal $S_{01}$, the MOS transistors $MN_{01}$ and $MN_{02}$ are turned off. Accordingly, most of the current supplied from the constant current source $IS_{01}$ is caused to flow through the diode $D_{01}$, and therefore, a corresponding current flows through each of the NPN transistors $Q_{03}$ and $Q_{05}$ which constitute the current mirror circuit together with the diode $D_{01}$. On the other hand, since the MOS transistor $MN_{02}$ is off, no current flows through the resistor $R_{01}$, so that a potential on the node $N_{05}$ becomes equal to the high power supply voltage Vcc. Accordingly, the P-channel MOS transistor is maintained in a cut-off condition. Namely, a base current of the NPN transistor $Q_{04}$ is not bypassed or shunted by the MOS transistor $MP_{01}$. Therefore, the differential circuit composed of the transistors $Q_{01}$ and $Q_{02}$ functions as the input stage for amplifying the input signal applied to the input signal terminals $I_{01}$ and $I_{02}$, and the transistors $Q_{04}$ and $Q_{05}$ function as the emitter follower for outputting the output of the input stage.

On the other hand, when the control signal of a high level is applied to the control signal terminal $S_{01}$, the MOS transistors $MN_{01}$ and $MN_{02}$ are turned on. Accordingly, most of the current supplied from the constant current source $IS_{01}$ is caused to flow through the MOS transistor $MN_{01}$. Therefore, almost no current flows through the diode $D_{01}$, and correspondingly, almost no current flows through each of the NPN transistors $Q_{03}$ and $Q_{05}$. On the other hand, since the MOS transistor $MN_{02}$ is in the on condition so as to allow the drain current through the resistor $R_{01}$. Therefore, the potential on the node $N_{05}$ drops to a level which is almost the same as the low power supply voltage Vss. Thus, the P-channel MOS transistor $MP_{01}$ is turned on so as to short-circuit between the base and the emitter of the transistor $Q_{04}$. As a result, the NPN transistor $Q_{04}$ is cut off. Accordingly, the transition time from the active condition to the inactive condition is remarkably shortened.

The invention has thus been shown and described with reference to the specific embodiments. However, it should be noted that the present invention is in no way limited to the details of the illustrated structures but changes and modifications may be made within the scope of the appended claims.

I claim:

1. An amplifier circuit configured to be selectively brought into an active condition or an inactive condition by a control signal, the amplifier circuit comprising an input stage having at least one input connected to an input terminal and one output, an output stage having a driving transistor connected in the form of an emitter follower and having a base connected to receive the output of the input stage and an emitter connected to an output terminal, a current source circuit connected to the emitter of the driving transistor and controlled by the control signal so as to supply a current required for operation of the driving transistor when the control signal indicates that the amplifier circuit should be set in the inactive condition, and a cut off the current required for operation of the driving transistor when the control signal indicates that the amplifier circuit should be set in the inactive condition, and to control circuit connected to the base of the driving transistor and controlled by the control signal so as to cut off a base current of the driving transistor in synchronism with the control signal indicating that the amplifier circuit should be set in the inactive condition, wherein the driving transistor is a first NPN transistor, and the control circuit operates to bring the base of the driving transistor into the same level as that of the emitter of the driving transistor in synchronism with the control signal indicating that the amplifier circuit should be put in the inactive condition.

2. An amplifier circuit claimed in claim 1 wherein the control circuit is composed of a first MOS transistor having a source-drain path connected between the base and the emitter of the driving transistor, a resistor connected between the high power supply voltage and a gate of the first MOS transistor, a second MOS transistor having a source-drain path connected between the gate of the first MOS transistor and the low power supply voltage, a gate of the second MOS transistor being connected to receive the control signal so that the first and second MOS transistors are maintained in an off condition by the control signal indicating that the amplifier circuit should be put in the active condition, and the first and second MOS transistors are brought in an on condition by the control signal indicating that the amplifier circuit should be put in the inactive condition.

3. An amplifier circuit claimed in claim 2 wherein the current source circuit includes a constant current source connected between a first node and a high power supply voltage, a diode having an anode connected to the first node and a cathode connected to the low power supply voltage, a third MOS transistor having a source-drain path connected between first node and the low power supply voltage, a gate of the third MOS transistor being connected to receive the control signal so that the third MOS transistor is maintained in an off condition by the control signal indicating that the amplifier circuit should be put in the active condition, and the third MOS transistor is brought into an on condition by the control signal indicating that the amplifier circuit should be put in the inactive condition, and a second NPN transistor having a collector connected to the emitter of the first NPN transistor, a base connected to the first node, and an emitter connected to the low power supply voltage.

4. An amplifier circuit claimed in claim 3 wherein the input stage includes third and fourth NPN transistors connected in the form of a differential circuit, bases of the third and fourth NPN transistors being connected to a pair of input terminals, respectively, collectors of the third and fourth NPN transistors being connected through an active load to the high power supply voltage, respectively, the collector of one of the third and fourth NPN transistors being connected to the base of the first NPN transistor, emitters of the third and fourth NPN transistors being connected in common to a collector of a fifth NPN transistor having an emitter connected to the low power supply voltage, a base of the fifth NPN transistor being connected to the first node.

5. An amplifier circuit configured to be selectively brought into an active condition or an inactive condition by a control signal, the amplifier circuit comprising an input stage having at least one input connected to an input terminal and one output, an output stage having a driving transistor formed of a first bipolar transistor connected in the form of an emitter follower and having a base connected to receive the output of the input stage and an emitter connected to an output terminal, a current source circuit connected to the emitter of the first bipolar transistor and controlled by the control signal so as to supply a current required for operation of the first bipolar transistor when the control signal indicates that the amplifier circuit should be put in the active condition, and to cut off the current required for operation of the first bipolar transistor when the control signal indicates that the amplifier circuit should be set in the inactive condition, and a control circuit connected to the base of the first bipolar transistor and controlled by the control signal so as to bring the base of the first bipolar transistor into the same level as that of the emitter of the first bipolar transistor in synchronism with the control signal indicating that the amplifier circuit should be set in the inactive condition, thereby to cut off a base current of the first bipolar transistor.

6. An amplifier circuit claimed in claim 5 wherein the control circuit is composed of a first MOS transistor having a source-drain path connected between the base and the emitter of the first bipolar transistor, a resistor connected between a first power supply voltage and a gate of the first MOS transistor, a second MOS transistor having a source-drain path connected between the gate of the first MOS transistor and a second power supply voltage, a gate of the second MOS transistor being connected to receive the control signal so that the first and second MOS transistors are maintained in an off condition by the control signal indicating that the amplifier circuit should be set in the active condition, and the first and second MOS transistors are brought in an on condition by the control signal indicating that the amplifier circuit should be set in the inactive condition.

7. An amplifier circuit claimed in claim 6 wherein the current source circuit includes a constant current source connected between a first node and the first power supply voltage, a diode having an anode connected between the first node and the second power supply voltage in a forward direction, a third MOS transistor having a source-drain path connected in parallel to the diode, a gate of the third MOS transistor being connected to receive the control signal so that the third MOS transistor is maintained in an off condition by the control signal indicating that the amplifier circuit should be set in the active condition, and the third MOS transistor is brought into an on condition by the control signal indicating that the amplifier circuit should be set in the inactive condition, and a second bipolar transistor having a collector connected to the emitter of the first bipolar transistor, a base connected to the first node, and an emitter connected to the second power supply voltage.

8. An amplifier circuit claimed in claim 7 wherein the input stage includes third and fourth bipolar transistors connected in the form of a differential circuit, bases of the third and fourth bipolar transistors being connected to a pair of input terminals, respectively, collectors of the third and fourth bipolar transistors being connected through an active load to the first power supply voltage, respectively, the collector of one of the third and fourth bipolar transistors being connected to the base of the first bipolar transistor, emitters of the third and fourth bipolar transistors being connected in common to a collector of a fifth bipolar transistor having an emitter connected to the second power supply voltage, a base of the fifth bipolar transistor being connected to the first node.

* * * * *